United States Patent

Schüllstrom et al.

[15] 3,701,075

[45] Oct. 24, 1972

[54] ELECTRONIC MICROELEMENT ASSEMBLY

[72] Inventors: Sten Gunde Schüllstrom; Ingvar Freijd; Arne Schäder; Nils Gunnar Olofsson, all of Linköping, Sweden

[73] Assignee: Saab-Scania Aktiebolag, Linkoping, Sweden

[22] Filed: Sept. 22, 1970

[21] Appl. No.: 74,327

[30] Foreign Application Priority Data

Sept. 25, 1969 Sweden ....................13161/69

[52] U.S. Cl.............339/17 CF, 317/101, 339/217 R
[51] Int. Cl...............................................H05k 1/02
[58] Field of Search........317/99, 100, 101 R, 101 C, 317/101 CC, 101 CP, 101 DH; 174/68.5, 35.5, 138.5, 52, 52.5; 206/46, 65; 339/17, 176, 75

[56] References Cited

UNITED STATES PATENTS

| | | | |
|---|---|---|---|
| 3,573,617 | 4/1971 | Randolph et al. | 324/158 F |
| 3,323,023 | 5/1967 | Walker | 339/17 CF X |
| 3,495,131 | 2/1970 | Melcher | 317/100 |
| 3,441,853 | 4/1969 | Bodine | 317/101 CP |

OTHER PUBLICATIONS

IBM Technical Disclosure Bulletin, " Joining DIP Modules to Printed Circuit Cards," Morgan et al., Vol. 11, no. 7, p. 736, Dec., 1968.

*Primary Examiner*—Marvin A. Champion
*Assistant Examiner*—Terrell P. Lewis
*Attorney*—Ira Milton Jones

[57] ABSTRACT

An electronic circuit microelement, seated on the upper surface of a supporting member, has its terminals projecting upwardly away from said surface to a level well above its body. Elongated connectors, one for each terminal, have medial parts anchored in the supporting member, pin-like lower parts projecting beneath the lower surface of the supporting member, and upper parts formed as upstanding S-shaped spring arms that engage the microelement terminals in a plane spaced above the microelement body so that the connectors can be soldered to the terminals by immersion.

4 Claims, 2 Drawing Figures

Figures 1, 2:
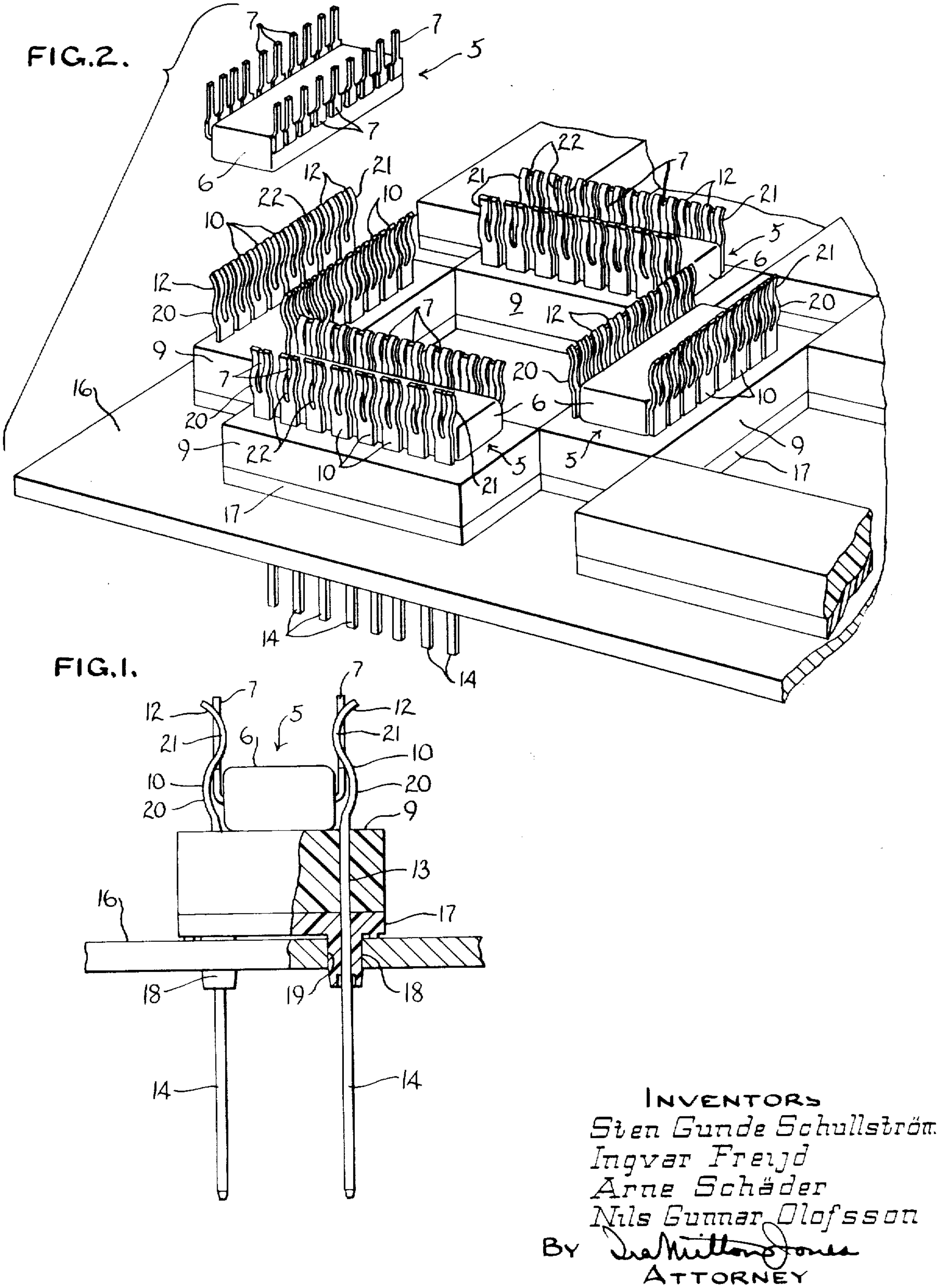

INVENTORS
Sten Gunde Schullström
Ingvar Freijd
Arne Schäder
Nils Gunnar Olofsson
BY [signature]
ATTORNEY

ELECTRONIC MICROELEMENT ASSEMBLY

This invention relates to an assembly for an electronic device comprising a so-called micromodule or integrated circuit microelement, and the invention is concerned more particularly with means for supporting an electronic circuit microelement and for making electrical connections with its terminals.

Micromodules or microelements are miniaturized solid state electronic components that can perform various subfunctions in an electronic system or circuit, such as amplification, integration and the like. An individual micromodule can be very small in size but can nevertheless perform operations that previously required a more bulky and complex combination of individual vacuum tubes or transistors with other electronic components.

Because of its small size, the micromodule presents a problem with respect to establishing electrical connections between its several terminals and other components with which it cooperates. In particular, a micromodule can be easily damaged by exposure to temperatures on the order of those employed in making ordinary solder joints, and therefore certain soldering techniques cannot be used in making connections to the terminals of a micromodule. One approach to the solution of this problem is to avoid making soldered connections directly to the micromodule terminals. U.S. Pat. No. 3,311,790, for example, discloses an assembly in which connector elements in the nature of leaf springs are engaged under bias with the micromodule terminals. Reference can also be made to French Pat. Nos. 1,260,145 and 1,487,777.

However, solder connections are obviously more satisfactory than mere pressure contacts, and the most satisfactory and economical way to make solder connections is by the dipping or immersion technique, whereby a number of connections can be directly immersed in molten solder simultaneously. Heretofore no expedient for connecting and supporting a micromodule has been devised that permits connections to the micromodule terminals to be made by immersion soldering.

With the foregoing in mind it is a general object of this invention to provide an assembly comprising a micromodule, a supporting member that can serve as a holder for the micromodule, and a plurality of connectors, each of which provides for making a connection between a terminal of the micromodule and another conductor, which assembly enables electrical connections to the micromodule terminals to be made by immersion soldering without likelihood of damage to the micromodule, and employs the connectors to secure the micromodule to the supporting member.

It is also an object of this invention to provide an assembly of the character described wherein the connectors are so shaped and arranged as to enable immersion soldering of other conductors to them, should this be desired, and also to enable a plug-in connection to be made between the microelement assembly and another component should such a connection be preferred.

With these observations and objectives in mind, the manner in which the invention achieves its purpose will be appreciated from the following description and the accompanying drawings, which merely exemplify the invention, it being understood that the nature of the invention is defined by the appended claims.

The accompanying drawings illustrate one complete example of an embodiment of the invention constructed according to the best mode so far devised for the practical application of the principles thereof, and in which:

FIG. 1 is a view partly in end elevation and partly in section of a microelement assembly embodying the principles of this invention; and FIG. 2 is a perspective view showing a number of microelement assemblies of this invention assembled with a circuit board, but with the microelement removed from one of the assemblies.

Referring now to the accompanying drawings, the numeral 5 designates generally a micromodule or microelement comprising a body 6 and a plurality of terminals 7 that project from opposite sides of the body to provide for connection of the microelement with other components of an electronic device. In the assembly of this invention the microelement 5 rests upon the flat upper surface of a support member 9 that comprises a plate of insulating material. The terminals 7 of the microelement project upwardly away from the upper surface of the supporting member, generally parallel to the sides of the microelement body from which they extend. Each terminal 7 has an increased width near the microelement body to provide a pair of upwardly facing shoulders.

The assembly also comprises a plurality of connectors 10, one for each of the terminals 7 of the microelement. The connector for each terminal, although preferably formed in one piece, can be regarded as comprising three parts, namely: an upper or terminal engaging part 12 that is adapted to have a solder connection to its terminal 7, a medial or anchoring part 13 that is secured in the supporting member 9, and a lower or contact part 14 which provides for connection of another conductor with its terminal 7. The medial and lower parts of the connector can comprise a straight pin, as shown, and its upper part is flattened, widened and bent to a form described hereinafter.

Because the medial parts 13 of the several connectors 10 are anchored in the supporting member 9, as by press fits, and their terminal engaging parts 12 are adapted to have soldered connections with their respective terminals 7, the connectors serve to secure the microelement to the supporting member 9.

The lower or contact part 14 of each connector preferably comprises a straight continuation of its medial anchoring part 13 and extends straight down from the bottom surface of the supporting member so that the several contact parts are parallel to one another and are adapted to provide the male elements or prongs of a plug and socket connection. Alternatively, of course, conductors can be attached to the several contact parts 14, and since the zones of attachment of such conductors to the contact parts can be coplanar, such connections can be readily soldered by immersion.

The assembly 5 can be accommodated on a circuit board or chassis 16 that also supports other similar assemblies. The arrangement of such assemblies in squares, as illustrated in FIG. 2, may be advantageous where many connections between a group of microelements must be made. In other cases it may be preferable to mount the assemblies on a circuit board with their microelements in parallel side-by-side relation.

The circuit board 16 can obviously be of insulating material, and etched conductors and suitable receptacles for the contact parts 14 can be applied to it in accordance with well-known practice; or, as shown, it can be of metal. In the latter case a plate 17 of insulating material can be interposed between the supporting member 9 and the circuit board, which plate has integral concentrically bored bosses 18 through which the contact parts extend and which project down into holes 19 in the circuit board to insulate the connectors from the circuit board.

The connectors are so arranged on the supporting member that certain of them have their terminal engaging parts 12 in opposing relationship, spaced to opposite sides of a zone occupied by the body 6 of the microelement. Terminal engaging parts at each side of the body 6 are of course spaced apart laterally by distances corresponding to the spacing of the terminals 7 that they engage.

Each terminal engaging part comprises a flattened spring that is bent along its length to a slightly S-shape so as to have a lower portion 20 which is bowed away from the body of the microelement, to be well spaced from the microelement, and an oppositely bowed upper portion 21 that crosses the plane of its upstanding terminal 7 of the microelement. Each terminal engaging part is bifurcated by a lengthwise extending medial slit 22 in which the upper portion of the terminal 7 is received with a close fit.

The lower portions 20 of the terminal engaging parts are spaced to opposite sides of the microelement body, but the curvature of the terminal engaging parts is such that the upper portions 21 of opposing ones may be spaced apart by a distance slightly less than the width of the microelement body. However, the terminal engaging parts flexingly yield as the microelement body is moved downward between them onto the supporting member, and the curvature of their upper portions allows them to be cammed apart by the microelement as it is thus moved downward.

Attention is directed to the fact that the terminal engaging parts 12 of the connectors have a length substantially greater than the thickness of the microelement body, so that they project a substantial distance above said body when the same is seated on the support member. It is also noteworthy that the zones of engagement of the several microelement terminals 7 with the terminal engaging parts are located substantially in a common plane, which plane is parallel to the upper surface of the supporting member and is spaced a substantial distance above the microelement body. By reason of this last described relationship the connections between the terminals 7 and the terminal engaging parts 12 can be soldered by direct immersion without danger of heat damage to the microelement.

From the foregoing description taken with the accompanying drawings it will be apparent that this invention provides an assembly comprising an integrated circuit microelement or micromodule, a supporting member, and simple connectors that secure the microelement to the supporting member and provide for a plug-in or soldered connection between the microelement terminals and other conductors, which assembly permits the connectors to be secured to the microelement terminals by immersion soldering without danger of heat damage to the microelement.

The invention is defined by the following claims:

1. An assembly comprising an electronic circuit microelement that has a plurality of terminals extending from a pair of opposite sides of its body, all of said terminals projecting in one direction and each of said terminals having a slender outer portion and a wider portion near the body that defines, at its junction with the outer portion, a pair of shoulders that face in said direction, a supporting member having a surface which the microelement body overlies, and a plurality of connectors carried by the supporting member in insulated relation to one another, said assembly being characterized by each of said connectors:

A. having a medial part anchored in the supporting member;

B. having a terminal engaging part that projects generally in said direction from said surface and which 1. is bifurcated to define a slot that has a substantially constant width along its length and in which the outer portion of a terminal is closely receivable;

2. has its bifurcations both curved in the same direction along their lengths so that the bifurcations engage over the shoulders on a terminal and cooperate therewith in confining the microelement against movement in said direction; and C. each of said connectors having another part which projects from another surface of the supporting member for connection with other conductors.

2. The assembly of claim 1 wherein each of said connectors is further characterized by D. the medial part and said other part of each connector comprising a straight pin.

3. The assembly of claim 1 wherein each of said connectors has its bifurcated portion sinuosly curved, further characterized by:

1. the portion of each bifurcation that is nearer said surface being curved in the direction to have its convex surface facing generally toward the microelement;

2. the portion of each bifurcation that is remote from said surface being curved in the opposite direction to have a zone of contact with a terminal near the outer end thereof; and 3. the curvatures of all of the bifurcations being substantially uniform so that their said zones of contact with the terminals lie substantially in a common plane to facilitate immersion soldering of the terminals to the connectors.

4. Means providing for the connection of conductors with an electric circuit microelement of the type that comprises a body having terminals at spaced intervals along its opposite sides, all of which terminals project in the same direction and each of which terminals has a slender outer portion and an inner portion, adjacent to the body, which is wider and which, at its junction with the outer portion, provides opposite shoulders that face in said direction, said means comprising:

A. a supporting member having a flat surface portion which can be overlain by a microelement;

B. a plurality of connectors, one for each terminal on a microelement, each anchored to the supporting member and having a part projecting from another surface portion of the supporting member for connection of a conductor thereto, each of said connectors having another part which 1. extends generally normal to said surface portion of the supporting member,
2. is bifurcated, with its bifurcations defining a slot that is of substantially constant width along its length and in which the slender outer portion of a terminal is closely receivable; and
3. the two bifurcations of each connector being curved in the same direction along their lengths so that they can engage over said shoulders on a terminal and thereby cooperate in confining the microelement against displacement away from said flat surface portion on the supporting member.

* * * * *